US008062776B2

(12) United States Patent
Waki et al.

(10) Patent No.: US 8,062,776 B2
(45) Date of Patent: Nov. 22, 2011

(54) SURFACE COATED TOOL AND METHOD OF WORKING CUTTING OBJECT

(75) Inventors: Masahiro Waki, Satsumasendai (JP); Masahito Matsuzawa, Satsumasendai (JP)

(73) Assignee: Kyocera Corporation, Kyoto (JP)

( * ) Notice: Subject to any disclaimer, the term of this patent is extended or adjusted under 35 U.S.C. 154(b) by 394 days.

(21) Appl. No.: 12/520,728

(22) PCT Filed: Dec. 17, 2007

(86) PCT No.: PCT/JP2007/074237
§ 371 (c)(1),
(2), (4) Date: Jun. 22, 2009

(87) PCT Pub. No.: WO2008/078592
PCT Pub. Date: Jul. 3, 2008

(65) Prior Publication Data
US 2010/0034603 A1 Feb. 11, 2010

(30) Foreign Application Priority Data
Dec. 25, 2006 (JP) ................................. 2006-347748
Mar. 27, 2007 (JP) ................................. 2007-082474

(51) Int. Cl.
*B23B 27/14* (2006.01)
(52) U.S. Cl. ............ 428/697; 51/307; 51/309; 407/119; 428/325; 428/698; 428/699
(58) Field of Classification Search .................... 51/307, 51/309; 428/325, 697, 698, 699; 407/119
See application file for complete search history.

(56) References Cited

U.S. PATENT DOCUMENTS

| 4,714,660 | A  | * | 12/1987 | Gates, Jr. ....................... 428/699 |
| 5,981,078 | A  | * | 11/1999 | Tabersky et al. ............... 407/119 |
| 6,884,499 | B2 | * | 4/2005  | Penich et al. .................... 51/307 |
| 7,060,345 | B2 | * | 6/2006  | Fukui et al. ..................... 428/697 |
| 7,083,868 | B2 | * | 8/2006  | Horling et al. .................. 51/309 |

(Continued)

FOREIGN PATENT DOCUMENTS

JP  09-323204  * 12/1997
(Continued)

OTHER PUBLICATIONS

T. Hurkmans et al., "Multilayered titanium tungsten nitride coatings with a superlattice structure grown by unbalanced magnetron sputtering" Surface and Coatings Technology, vol. 76-77, pp. 159-166, 1995.

(Continued)

*Primary Examiner* — Archene Turner
(74) *Attorney, Agent, or Firm* — DLA Piper LLP (US)

(57) ABSTRACT

A surface coated tool comprises a substrate and a coating layer superimposed on the surface of the substrate and containing Ti and W in the form of nitride or carbonitride. The coating layer comprises a matrix and dispersed particles dispersed into the matrix. The W content of the dispersed particles is larger than the W content of the matrix, and a difference in the W content between the matrix and the dispersed particles is larger than a difference in other ingredient content. A cutting tool consisting of the surface coated tool and having a cutting edge is prepared, and the cutting edge of the cutting tool is brought into contact with a cutting object, and the cutting object is cut by the cutting tool.

13 Claims, 3 Drawing Sheets

U.S. PATENT DOCUMENTS

| | | |
|---|---|---|
| 7,258,912 B2 | 8/2007 | Yamamoto et al. |
| 7,354,640 B2 * | 4/2008 | Kubota .................. 428/699 |
| 7,521,131 B2 * | 4/2009 | Yamamoto ............... 428/698 |
| 2005/0170162 A1 | 8/2005 | Yamamoto et al. |

FOREIGN PATENT DOCUMENTS

| | | | |
|---|---|---|---|
| JP | 10-251831 | | 9/1998 |
| JP | 2000-326108 | * | 11/2000 |
| JP | 2001-293601 | | 10/2001 |
| JP | 2002-129306 | | 5/2002 |
| JP | 2002-256967 | | 9/2002 |
| JP | 2003-211305 | * | 7/2003 |
| JP | 2004-100004 | | 4/2004 |
| JP | 2005-330540 | | 12/2005 |
| JP | 2006-111915 | | 4/2006 |
| JP | 2006-192531 | | 7/2006 |

OTHER PUBLICATIONS

European search report for corresponding European application 07850725.8 lists the references above, Oct. 22, 2010.

* cited by examiner

Live Time: 50.0 sec.

Wed Jan 24 08:53:02 2007
Filter Fit  Chi Squared:1.614
Correction Method: Cliff-Lorimer (MBTS) w/o Absorbance
Acc.Voltage: 200.0 kV  Take Off Angle: 23.0 deg.
Detector: Pioneer

| Element Line | Weight % | Weight % Error | Atom % | Atom % Error |
|---|---|---|---|---|
| N K  | 20.28 | +/- 1.08 | 42.74 | +/- 2.27 |
| Al K | 25.50 | +/- 0.34 | 27.91 | +/- 0.37 |
| Si K | 0.27 | +/- 0.14 | 0.29 | +/- 0.15 |
| Ti K | 43.93 | +/- 0.50 | 27.08 | +/- 0.31 |
| Nb K | 2.45 | +/- 0.43 | 0.78 | +/- 0.14 |
| W L  | 7.57 | +/- 0.85 | 1.22 | +/- 0.14 |
| Total | 100.00 |  | 100.00 |  |

Region A

Live Time: 50.0 sec.

Wed Jan 24 08:44:51 2007
Filter Fit  Chi Squared:2.828
Correction Method: Cliff-Lorimer (MBTS) w/o Absorbance
Acc.Voltage: 200.0 kV  Take Off Angle: 23.0 deg.
Detector: Pioneer

| Element Line | Weight % | Weight % Error | Atom % | Atom % Error |
|---|---|---|---|---|
| Al K | 1.72 | +/- 0.11 | 8.24 | +/- 0.53 |
| Ti K | 8.25 | +/- 0.18 | 22.29 | +/- 0.47 |
| Nb L | 8.81 | +/- 0.40 | 12.28 | +/- 0.56 |
| W L  | 81.22 | +/- 1.42 | 57.19 | +/- 1.00 |
| Total | 100.00 |  | 100.00 |  |

Region B

SURFACE COATED TOOL AND METHOD OF WORKING CUTTING OBJECT

CROSS-REFERENCE TO THE RELATED APPLICATIONS

This application is a national stage of international application No. PCT/JP2007/074237 filed on Dec. 17, 2007, which also claims the benefit of priority under 35 USC 119 to Japanese Patent Application No. 2006-347748 filed on Dec. 25, 2006 and Japanese Patent Application No. 2007-082474 filed on Mar. 27, 2007, the entire contents of which are incorporated herein by reference.

TECHNICAL FIELD

The present invention relates to a surface coated tool having a coating layer formed on the surface of a substrate, and a method of working a cutting object.

BACKGROUND ART

In present day, tools, for example, wear resistant tools such as cold forging and warm forging tools, e.g., punches and headers, and cutting tools require wear resistance and sliding properties, as well as fracture resistance. These tools employ techniques that improve wear resistance, sliding properties and fracture resistance by forming various coating layers on the surface of a substrate of a hard material such as a WC-based hard metal, TiCN-based cermet, ceramics, diamond or cBN.

As the coating layer, a TiCN layer and a TiAlN layer have been generally widely employed. Various measures have been taken to bring about higher wear resistance and improve fracture resistance.

For example, Japanese Unexamined Patent Publication No. 2001-293601 describes a cutting tool having on the substrate surface thereof a wear-resistant coating that contains at least one type of ultrafine particle compound having an extremely high hardness selected from the group consisting of $B_4C$, BN, $TiB_2$, TiB, TiC, WC, SiC, $SiN_x$ (x=0.5 to 1.33) and $Al_2O_3$. This publication discloses that the hardness of the coating is improved by containing the ultrafine particle compound.

Japanese Unexamined Patent Publication No. 10-251831 discloses a hard coating layer having the structure that a Ti oxide, an Al oxide and an M oxide are dispersion distributed in a TiAlMN-based substrate by forming a TiAlMN-based hard coating layer, followed by heat oxidation treatment.

Japanese Unexamined Patent Publication No. 2002-129306 discloses a composite hard coating in which the coating is enhanced by dispersing TiAlN composite nitride dispersed particles having a different composition ratio from the coating matrix, and dispersed particles such as TiAlVN, TiAlZrN, TiAlCrN or the like, each containing a different element from the coating matrix, into a TiAlN-based hard coating.

DISCLOSURE OF THE INVENTION

Technical Problem

According to one aspect of the invention, a surface coated tool comprises a substrate and a coating layer superimposed on the surface of the substrate and containing Ti and W in the form of nitride or carbonitride. The coating layer comprises a matrix and dispersed particles dispersed into the matrix. The W content of the dispersed particles is larger than the W content of the matrix, and a difference in the W content between the matrix and the dispersed particles is larger than a difference in other ingredient content.

According to other aspect of the invention, a method of working a cutting object has three steps. The first step includes preparing a cutting tool comprising the above-mentioned surface coated tool and having a cutting edge. The next step includes bringing the cutting edge of the cutting tool into contact with a cutting object. The last step includes cutting the cutting object by the cutting tool.

BEST MODE FOR CARRYING OUT THE INVENTION

A surface coated cutting tool according to a embodiment of the invention will be described below.

In the surface coated cutting tool (hereinafter referred to simply as "tool"), a crossing ridge between a rake face and a flank face is configured to become a cutting edge. A coating layer 2 covers the surface of a substrate 1.

Figure 1:
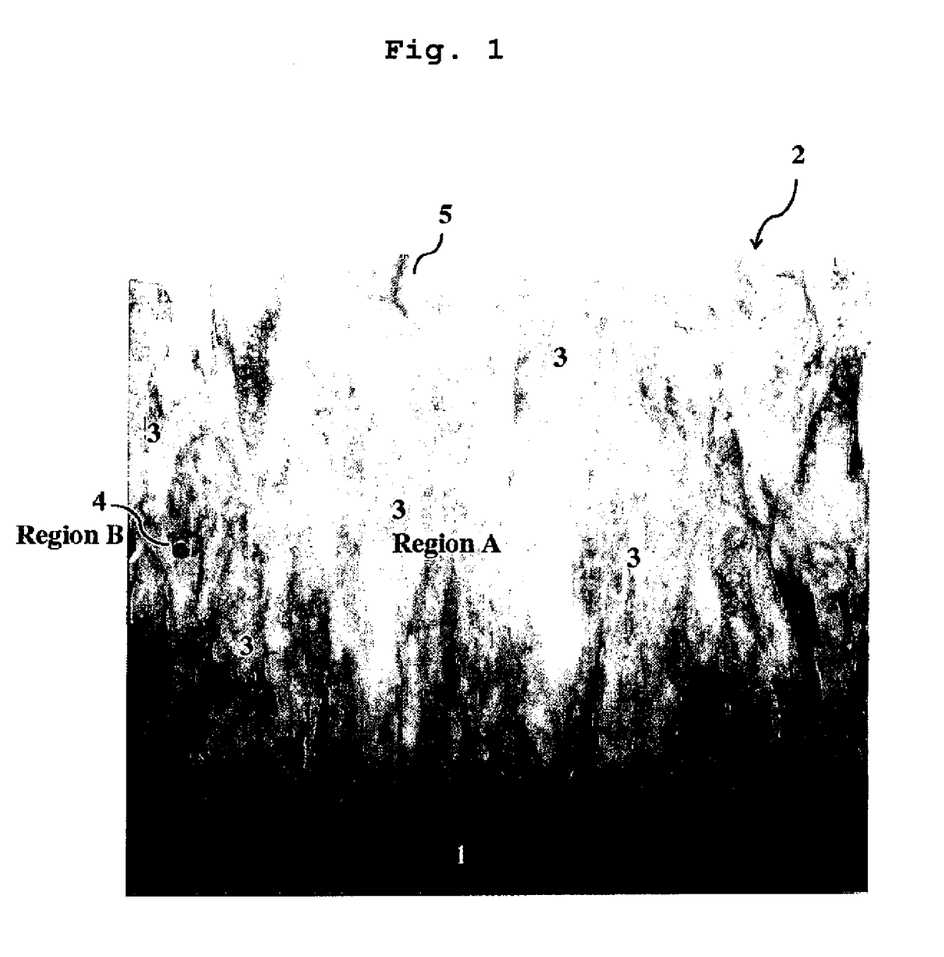
FIG. 1 is a transmission electron microscope (TEM) photograph of a coating layer in a surface coated tool according to one embodiment of the invention.
Figure 2:
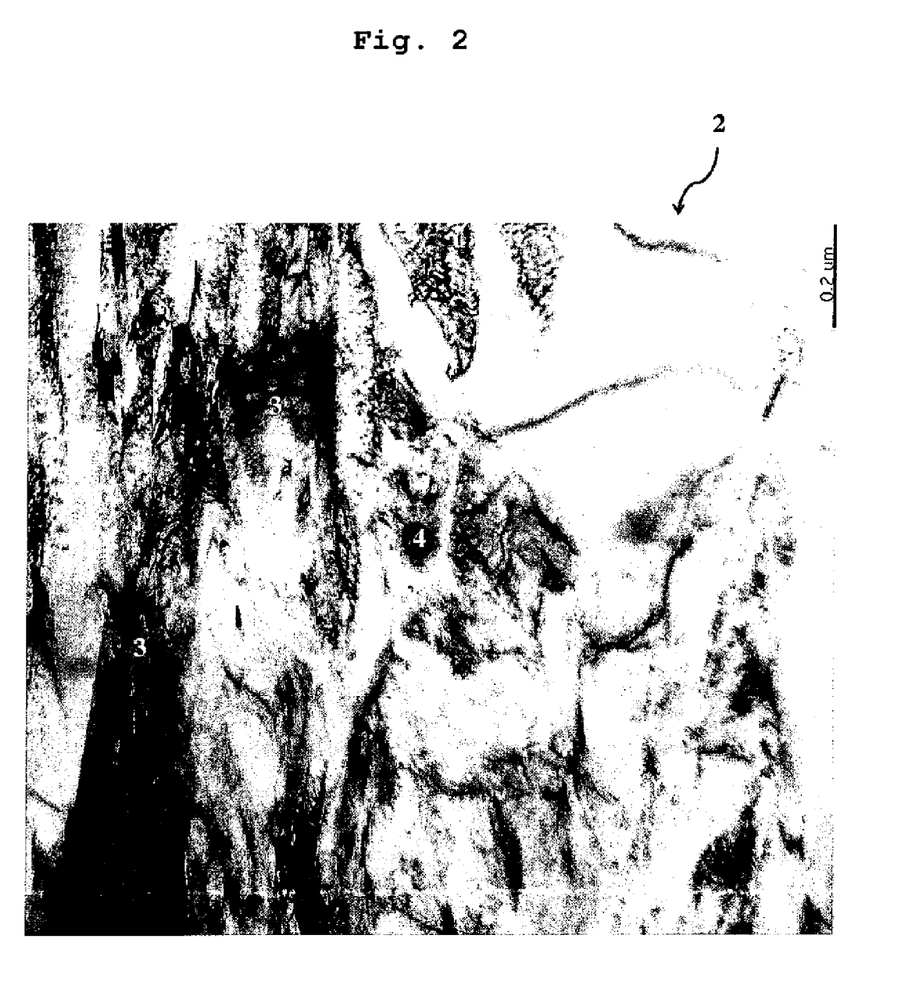
FIG. 2 is a transmission electron microscope (TEM) photograph of a coating layer in a tool according to other embodiment of the invention.
Figure 3:
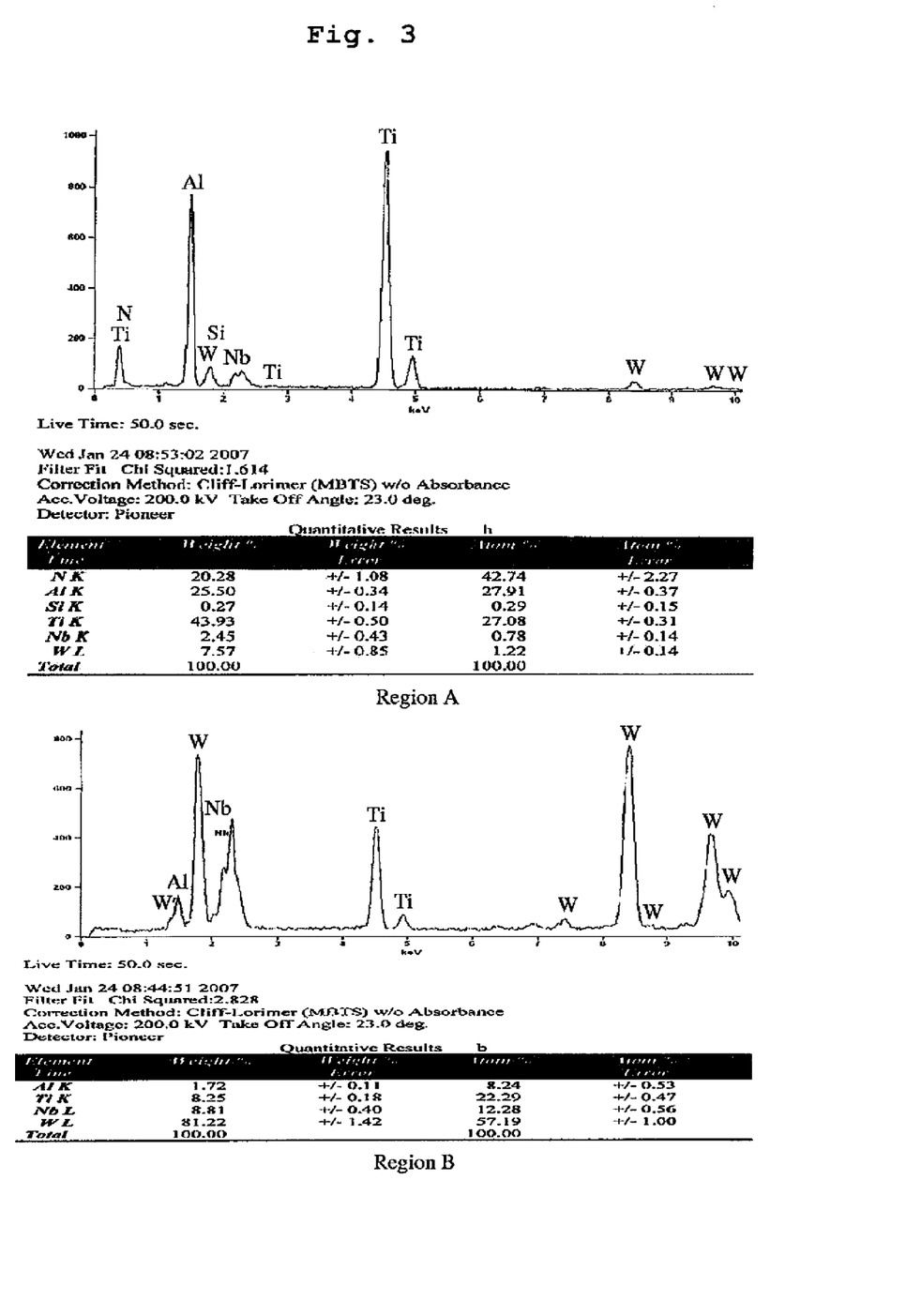
FIG. 3 shows energy dispersive spectroscopic analysis (EDS) data of columnar particles (region A) and granular particles (region B) shown at the coating layer in FIG. 2.

The coating layer 2 is composed of nitride or carbonitride, each containing Ti and W. With reference to FIGS. 1 and 2, a matrix is composed of columnar particles 3. Dispersed particles exist at least within the columnar particles 3 or between the columnar particles 3. In FIGS. 1 and 2, the dispersed particles are in the form of granular particles 4, specifically spherical particles having a substantially spherical shape. As shown in FIG. 3, the composition of the granular particles 4 (region B) has a greater W content than the composition of the columnar particles 3 (region A), and the difference in the W content between the composition of the columnar particles 3 (the region A) and the composition of the granular particles 4 (the region B) is larger than the difference in other ingredient content.

Owing to the above construction, the residual stress developed within the coating layer 2 can be reduced, thereby avoiding self-destruction even when the thickness of the coating layer 2 is as thick as not less than 3 μm. This enables the stable coating layer 2 causing neither any partial fracture nor peeling, and also enhances the tenacity of the coating layer 2 and improves the fracture resistance thereof.

In the present invention, the columnar particles 3 mean crystals having an aspect ratio of 1.5 or more. The aspect ratio is obtained by dividing the dimension in the thickness direction of the coating layer 2 (i.e., the crystal length) (the direction vertical to the interface with the substrate) by the crystal width (in the direction parallel to the interface with the substrate). As apparent from FIGS. 1 and 2, the shape of the columnar particles of the invention is not limited to a rectangle whose longitudinal cross-section is elongated, and they may have a triangle which narrows with approach towards its longitudinal tip end. In some cases, a bulky particle 5 as shown in FIG. 1 may exist in the matrix.

On the other hand, the granular particles 4 in the present invention mean crystals, the aspect ratio of which is smaller than 1.5. With a view to enhancing the effect of relaxing residual stress, the dispersed particles (the granular particles 4) in the invention are preferably three-dimensional spherical particles having a circular cross-section and having no corner, such as polygon.

Like the composition of the coating layer 2 in FIG. 1, which is shown in FIG. 3, the composition of the granular particles 4 contain essentially W, and preferably contains, besides W and nitrogen (N), Ti, Al, M, Si and Co in order to improve the hardness and toughness of the granular particles 4.

Although in the coating layer 2 having the above composition, the dispersed particles (the granular particles 4) may be composed of $WN_x$ (provided $0 \leq x \leq 1$), they are preferably composed of $(Ti_{1-a-b-c}Al_aM_bW_c)(C_{1-x}N_x)_z$ wherein M is one or more types selected from the groups 4, 5 and 6 elements in the periodic table excluding Ti and W, rare earth elements and Si, and $0 \leq a \leq 0.4$, $0 \leq b \leq 0.5$, $0.01 \leq c \leq 1$, $0.2 \leq x \leq 1$, and $0.1 \leq z \leq 1$, in order to improve resistance.

The columnar particles 3 are preferably composed of $(Ti_{1-a-b-c}Al_aM_bW_c)(C_{1-y}N_y)_z$ wherein M is one or more types selected from the groups 4, 5 and 6 elements in the periodic table excluding Ti and W, rare earth elements and Si, $0.4 \leq a \leq 0.7$, $0 \leq b \leq 0.5$, $0.01 \leq c \leq 0.3$, $0.2 \leq y \leq 1$, and $0.9 \leq z \leq 1.1$, in order to enhance the adhesion between the columnar particles 3 and the granular particles 4, and improve resistance.

In the above construction, the coating layer 2 preferably has the entire composition of $(Ti_{1-a-b-c}Al_aM_bW_c)(C_{1-y}N_y)_z$ wherein M is one or more types selected from the groups 4, 5 and 6 elements in the periodic table excluding Ti and W, rare earth elements and Si, $0.4 \leq a \leq 0.65$, $0 \leq b \leq 0.5$, $0.01 \leq c \leq 0.3$, $0.2 \leq y \leq 1$, and $0.9 \leq z \leq 0.1$, in order to maintain wear resistance and resistance required for tools.

Especially, among the above compositions, as M, Si is preferably contained at the ratio of 0.01 to 0.05 (1 to 5 atomic percentages). Within this composition range, the oxidization initiation temperature of the coating layer 2 can be raised to enhance oxidation resistance and improve the wear resistance during cutting, and chipping that is liable to occur at the tip end of the cutting edge can be reduced to provide high resistance. In this case, as metal M, Nb or Mo is preferably contained for imparting the most excellent wear resistance and oxidation resistance.

The non-metal ingredients of the coating layer 2, namely C and N, have excellent hardness and tenacity necessary for cutting tools. The especially desirable range of y (N content) is $0.5 \leq y \leq 1$ in order to reduce the bulky particles (droplets) 5 occurred in the surface of the coating layer 2. In the present invention, the composition of the coating layer 2 can be measured by energy dispersive X-ray (EDX) spectroscopic analysis method or X-ray photoelectron spectroscopic analysis (XPS) analysis method.

Even when the thickness of the coating layer 2 is as large as 3 μm or more, the coating layer 2 is hard to chipping. Even when the coating layer 2 has a thickness of 0.5 to 6 μm, it is capable of preventing peeling and chipping of the coating layer 2, thereby maintaining sufficient wear resistance.

The granular particles 4 having a mean grain size of 5 to 200 nm are desirable to enhance the toughness of the coating layer 2. The columnar particles 3 having a mean crystal width of 50 to 500 nm are desirable to enhance the hardness and strength of the coating layer 2, enabling an improvement in the wear resistance thereof.

The ratio of the dispersed particles (the granular particles 4) in cross-sectional structural observation is desirably 0.1 to 25% by area, which enables to improve the fracture resistance of the coating layer 2 and maintain the wear resistance of the coating layer 2. The especially preferable range of the ratio of the dispersed particles (the granular particles 4) is 0.1 to 10% by area, and more preferably 0.1 to 5% by area.

The N content ($x_{suf}$) in the outer peripheral part of the dispersed particles (the granular particles 4) is preferably larger than the N content ($x_{in}$) in the central part of the dispersed particles (the granular particles 4). This enables to enhance the tenacity of the granular particles 4 and the plastic deformation resistance thereof.

The Al content $b_s$ in the surface of the coating layer 2 is preferably larger than the Al content $b_b$ in the vicinity of the substrate 1, especially the ratio of the $b_s$ and the $b_b$, namely ($b_s/b_b$), is preferably 1.1 to 1.25. This enables to enhance the oxidation resistance at high temperatures of the surface coated tool. The weight change rate in the test in which the surface coated tool is held at 1000° C. in the atmosphere for one hour, corresponding to the evaluation method that estimates oxidation resistance, is preferably less than 2.5%.

Hard materials are suitably used as the substrate 1. Examples thereof include hard metal consisting of a hard phase composed mainly of tungsten carbide or titanium carbonitride and a binding phase composed mainly of iron-group metal such as cobalt or nickel, cermet, ceramics composed mainly of silicon nitride or aluminum oxide, and ultra-high pressure sintered body obtained by sintering both a hard phase composed of polycrystalline diamond or cubic boron nitride and a binding phase such as ceramics or an iron group metal under ultra-high pressure. Alternatively, steel and high speed steel may be also usable.

<Manufacturing Method>

A method of manufacturing a surface coated cutting tool as an example of the surface coated tools of the invention will be described below.

Firstly, a tool-shaped substrate 1 is prepared by any conventional method. Subsequently, a coating layer 2 is formed on the surface of the substrate 1. As the method of forming the coating layer 2, physical vapor deposition (PVD) methods such as ion plating method and sputtering method are suitably applicable. A detailed description will be given of an example of the coating methods, that is, the case where the coating layer 2 is formed by ion plating method. Using a metal target or a composite alloy target independently containing metal titanium (Ti), metal aluminum (Al), metal tungsten (W), metal silicon (Si), and metal M (M is one or more types selected from Nb, Mo, Ta, Hf and Y), a metal source is vaporized and ionized by arc discharge and glow discharge, and at the same time, reacted with nitrogen ($N_2$) gas that is a nitrogen source and methane ($CH_4$)/acetylene ($C_2H_2$) gas that is a carbon source, thereby obtaining the coating. The adhesion and hardness of the coating layer 2 with respect to the substrate are improved by introducing a mixed gas of nitrogen ($N_2$) gas and argon (Ar) gas as a coating atmosphere so that the inside of the coating chamber is 1 to 10 Pa.

At this time, two types of targets, specifically a first target as a main target and a second target as a subtarget are used. The second target may be composed of tungsten nitride (WN), or a mixture of tungsten nitride (WN) and tungsten (W). Alternatively, the second target may be composed of a mixture which is composed mainly of a mixture of tungsten nitride (WN) and, if desired, tungsten (W), and which further contains a Ti source and an Al source. The first target is constructed from a composition for supplying the rest ingredients. Then, the coating layer 2 is formed with ion plating method or sputtering method by using these two types of targets, resulting in the coating layer 2 in which the dispersed particles (the granular particles 4) having a large W content are dispersed in the above-mentioned matrix (the columnar particles 3).

As the method of forming the coating layer 2, ion plating method and sputtering method are suitably employed, with which the coating layer 2 having a high hardness can be obtained by controlling the crystal structure and orientation of the coating layer 2. Particularly, the coating is preferably carried out under the conditions that a bias voltage of 30 to 200V is applied with ion plating method in order to enhance the adhesion to the substrate 1.

Aside from the above third target, another third target, which is composed only of metal aluminum (Al) or has a large content of metal aluminum (Al), is prepared, and the discharge power against this target is increased in the latter part of the coating. This enables the formation of a coating layer in which an Al content in the coating layer surface, namely $b_s$, is larger than an Al content in the vicinity of the substrate, namely $b_b$.

Although the invention has been described through the preferred embodiment of the cutting tool, the invention is not limited to the cutting tools such as throwaway chips, drills and end mills, and it is applicable to other tools, for example, wear resistant tools such as cold forging tools and warm forging tools, e.g., punches and headers, and solid type cutting tools.

Example 1

To tungsten carbide (WC) powder having a mean grain size of 0.5 μm, 10% by mass of metal cobalt (Co) powder, and a 1% by mass of the total of vanadium carbide (VC) powder and chrome carbide ($Cr_3C_2$) powder were added and mixed. The mixture was molded in the shape of an end mill and then sintered. After this was subjected to the grinding step, the surface thereof was cleaned with alkali, acid and distilled water in this order, thereby obtaining a four-tooth end mill substrate having an outer diameter of 16 mm.

The obtained substrate was set into an arc ion plating device or a sputtering device with the main target and the subtarget shown in Tables 1 and 2 mounted thereon, and heated to 550° C., thereby forming the coating layers shown in Tables 1 and 2, respectively. The coating conditions were that the heating temperature of the substrate was 550° C. at the bias voltage shown in Table 1 in the atmosphere of a total pressure of 4 Pa using a mixed gas of nitrogen gas and argon gas. The ark current in ark ion plating method was 150A, the current in hollow cathode ion plating method was 200A, and the electric power in sputtering method was 5000W. The structure and composition of the coating layer, such as the ratio of the dispersed particles, were adjusted by changing the ratio and arrangement of the individual targets.

Each of the obtained end mills was observed at 500 magnifications through a scanning electron microscope (VE8800) manufactured by Keyence Co., Ltd. The quantitative analysis of the entire composition of the coating layer was carried out with ZAF method that is one of energy dispersive X-ray spectroscopy (EDX) methods at an acceleration voltage of 15 kV by using an EDAX analyzer (AMETEX EDAX-VE9800) installed in the above microscope. With regard to the element that could not be measured in this method because the detection peak thereof was overlapped with the detection peak of other element, for example, nitrogen whose detection peak was overlapped with the detection peak of Ti, its detailed composition was determined as follows. Using an X-ray photoelectron spectroscopy (Quantum2000) manufactured by PHI, Inc., measurements were carried out by irradiating, as an X-ray source, monochrome AlK (200 μm, 35W, 15 kV) to a measuring region of approximately 200 μm. Further, the layer thickness of the coating layer was measured through a cross-sectional microscopic photograph. The results were presented in Tables 1 and 2.

TABLE 1

| Sample No. | Target First target (Main) | Target Second target (Sub) | Coating condition Method[1] | Coating condition Bias voltage (V) | Coating condition Time (min.) | Coating layer Composition | Coating layer Layer thickness (μm) |
|---|---|---|---|---|---|---|---|
| 1 | TiAl | WN | AIP | 100 | 35 | $Ti_{0.40}Al_{0.56}W_{0.04}N$ | 3.5 |
| 2 | TiAlNbSi | WN + W | AIP | 150 | 30 | $Ti_{0.42}Al_{0.48}W_{0.04}Si_{0.03}Nb_{0.03}N$ | 3.0 |
| 3 | TiAlTa | WN + W | AIP | 120 | 35 | $Ti_{0.40}Al_{0.48}W_{0.07}Ta_{0.05}N$ | 3.5 |
| 4 | TiAlY | WN | AIP | 200 | 35 | $Ti_{0.40}Al_{0.49}W_{0.05}Y_{0.06}C_{0.1}N_{0.9}$ | 3.4 |
| 5 | TiAlHf | WN | AIP | 150 | 8 | $Ti_{0.40}Al_{0.48}W_{0.06}Hf_{0.06}C_{0.2}N_{0.8}$ | 0.9 |
| 6 | TiAlMo | WN + W | AIP | 100 | 15 | $Ti_{0.36}Al_{0.48}W_{0.05}Mo_{0.11}N$ | 1.6 |
| 7 | TiAlCr | WN + W | AIP | 50 | 40 | $Ti_{0.40}Al_{0.51}W_{0.05}Cr_{0.04}N$ | 4.2 |
| 8 | TiAlZr | WN | AIP | 100 | 10 | $Ti_{0.5}Al_{0.45}W_{0.02}Zr_{0.03}N$ | 1.1 |
| 9 | TiAlSi | WN + W | AIP | 100 | 35 | $Ti_{0.40}Al_{0.53}W_{0.05}Si_{0.02}N$ | 3.5 |
| 10 | TiSi | WN + W | HC | 150 | 32 | $Ti_{0.45}W_{0.45}Si_{0.1}N$ | 3.0 |
| *11 | TiAlW | None | AIP | 50 | 40 | $Ti_{0.44}Al_{0.48}W_{0.08}N$ | 4.2 |
| *12 | TiAlNb | W | SP | 100 | 80 | $Ti_{0.41}Al_{0.50}W_{0.07}Nb_{0.02}N$ | 4.1 |
| *13 | TiAl | WC | AIP | 200 | 35 | $Ti_{0.44}Al_{0.48}W_{0.08}N$ | 3.1 |

The samples marked "*" are out of the scope of the present invention.
[1]Method
AIP: Arc ion plating method,
HC: Hollow cathode ion plating method
SP: Sputtering method

TABLE 2

| Sample No. | Target First target (Main) | Target Second target (Sub) | Coating condition Method[1] | Coating condition Bias voltage (V) | Coating condition Time (min.) | Coating layer Composition | Coating layer Layer thickness (μm) |
|---|---|---|---|---|---|---|---|
| 14 | TiAl | TiAlWN | AIP | 100 | 35 | $Ti_{0.40}Al_{0.56}W_{0.04}N$ | 3.7 |
| 15 | TiAlNbSi | TiAlWN + W | AIP | 150 | 30 | $Ti_{0.42}Al_{0.48}W_{0.04}Si_{0.03}Nb_{0.03}N$ | 3.1 |
| 16 | TiAlTa | TiAlWN + W | AIP | 120 | 35 | $Ti_{0.40}Al_{0.48}W_{0.07}Ta_{0.05}N$ | 3.4 |
| 17 | TiAlY | TiAlWN | AIP | 200 | 35 | $Ti_{0.40}Al_{0.49}W_{0.05}Y_{0.06}C_{0.1}N_{0.9}$ | 3.3 |
| 18 | TiAlHf | TiAlWN | AIP | 150 | 8 | $Ti_{0.40}Al_{0.48}W_{0.06}Hf_{0.06}C_{0.2}N_{0.8}$ | 1.1 |
| 19 | TiAlMo | TiAlWN + Mo | AIP | 80 | 20 | $Ti_{0.36}Al_{0.48}W_{0.05}Mo_{0.11}N$ | 2.2 |

TABLE 2-continued

|  | Target | | Coating condition | | | Coating layer | |
| --- | --- | --- | --- | --- | --- | --- | --- |
| Sample No. | First target (Main) | Second target (Sub) | Method[1] | Bias voltage (V) | Time (min.) | Composition | Layer thickness (μm) |
| 20 | TiAlCr | TiAlWN + W | AIP | 60 | 35 | $Ti_{0.40}Al_{0.51}W_{0.05}Cr_{0.04}N$ | 3.3 |
| 21 | TiAlZr | TiAlWN | AIP | 120 | 20 | $Ti_{0.5}Al_{0.45}W_{0.02}Zr_{0.03}N$ | 2.1 |
| 22 | TiAlSi | TiAlNbN + W | AIP | 150 | 30 | $Ti_{0.40}Al_{0.53}Nb_{0.04}W_{0.01}Si_{0.02}N$ | 3.0 |
| 23 | TiSi | TiAlNbN + W | HC | 90 | 20 | $Ti_{0.45}Nb_{0.30}W_{0.15}Si_{0.05}N$ | 1.6 |
| *24 | TiAlMo | None | AIP | 50 | 40 | $Ti_{0.40}Al_{0.42}Mo_{0.18}N$ | 4.2 |
| *25 | TiAlNb | TiAlNbWN | HC | 120 | 40 | $Ti_{0.43}Al_{0.51}Nb_{0.05}W_{0.01}N$ | 2.4 |
| *26 | TiAl | TiAlZrN | AIP | 200 | 35 | $Ti_{0.44}Al_{0.48}Zr_{0.08}N$ | 3.1 |

The samples marked "*" are out of the scope of the present invention.
[1]Method
AIP: Arc ion plating method,
HC: Hollow cathode ion plating method
SP: Sputtering method The presence and absence of granular particles having a large W content was confirmed by observing the coating layer through a transmission electron microscope. With regard to the matrix (the columnar particles) and the dispersed particles (the granular particles), the compositions of arbitrary three crystals were determined by energy dispersive spectroscopy (EDS) analysis method, and the amount of N in the central part and that in the outer peripheral part were determined. The area ratios of the granular particles in three arbitrary regions each in dimensions of 1 μm by 5 μm were calculated. The results were presented in Tables 3 to 5.

Using the obtained end mills, the cutting test under the following cutting conditions was carried out by applying the cutting edge of each of these end mills to a working portion of a cutting object (a work material). The results were presented in Tables 3 and 5.

Cutting method: Shoulder cutting (down-cut)
Work material: SCM440
Cutting speed: 80 m/min
Feed rate: 0.025 mm/tooth
Cut: Depth of cut $a_p$=18 mm×lateral length of cut $a_e$=1.5 mm
Cutting state: Air blow
Evaluation method: The presence and absence of chipping, and the measurements of the wear width of the flank face after a 90-minute cutting

TABLE 3

|  | | Granular particle (Dispersed particle) | | | | | |
| --- | --- | --- | --- | --- | --- | --- | --- |
| Sample No. | Mean width of columnar particle (μm) | Composition (Central part) | Composition (Outer peripheral part) | Mean grain size (μm) | Area ratio (% by area) | Wear width of flank face (mm) | Cutting edge condition |
| 1 | 0.25 | $WN_{0.5}$ | $WN_{0.5}$ | 0.02 | 6 | 0.06 | Excellent |
| 2 | 0.2 | $WN_{0.2}$ | $WN_{0.5}$ | 0.05 | 3 | 0.028 | Excellent |
| 3 | 0.24 | $WN_{0.3}$ | $WN_{0.6}$ | 0.15 | 9 | 0.04 | Excellent |
| 4 | 0.15 | $WN_{0.1}$ | $WN_{0.5}$ | 0.12 | 4 | 0.052 | Minute chipping |
| 5 | 0.21 | $WN_{0.2}$ | $WN_{0.4}$ | 0.07 | 4 | 0.047 | Excellent |
| 6 | 0.30 | $WN_{0.2}$ | $WN_{0.4}$ | 0.05 | 3 | 0.03 | Excellent |
| 7 | 0.56 | $WN_{0.3}$ | $WN_{0.4}$ | 0.05 | 2 | 0.031 | Excellent |
| 8 | 0.28 | $WN_{0.4}$ | $WN_{0.4}$ | 0.08 | 6 | 0.058 | Minute chipping |
| 9 | 0.32 | $WN_{0.5}$ | $WN_{0.7}$ | 0.1 | 3 | 0.036 | Excellent |
| 10 | 0.26 | $WN_{0.3}$ | $WN_{0.3}$ | 0.11 | 12 | 0.063 | Minute chipping |
| *11 | 0.41 | None | | — | — | 0.088 | Large chipping |
| *12 | 0.30 | None | | — | — | 0.112 | Large wear |
| *13 | 0.13 | WC | | 0.12 | 10 | 0.079 | Large chipping |

The samples marked "*" are out of the scope of the present invention.

TABLE 4

|  |  | Granular particle | | | |
| --- | --- | --- | --- | --- | --- |
|  |  | N ratio (mol %) | | Mean grain size (μm) | Area ratio (% by area) |
| Sample No. | Composition | Central part | Outer peripheral part | | |
| 14 | $Ti_{0.22}Al_{0.18}W_{0.60}N$ | 51.1 | 49.5 | 0.03 | 6 |
| 15 | $Ti_{0.34}Al_{0.28}W_{0.27}Si_{0.06}Nb_{0.04}Co_{0.01}N$ | 19.8 | 45.8 | 0.05 | 0.5 |
| 16 | $Ti_{0.23}Al_{0.32}W_{0.32}Ta_{0.12}N$ | 26.5 | 39.7 | 0.14 | 4 |
| 17 | $Ti_{0.36}Al_{0.35}W_{0.18}Y_{0.10}C_{0.1}N_{0.9}$ | 20.1 | 50.3 | 0.12 | 4 |
| 18 | $Ti_{0.21}Al_{0.34}W_{0.32}Hf_{0.11}C_{0.2}N_{0.8}$ | 25.4 | 44.6 | 0.09 | 4 |

TABLE 4-continued

| | | Granular particle | | | |
|---|---|---|---|---|---|
| | | N ratio (mol %) | | | |
| Sample No. | Composition | Central part | Outer peripheral part | Mean grain size ($\mu$m) | Area ratio (% by area) |
| 19 | $Ti_{0.26}Al_{0.38}W_{0.25}Mo_{0.11}N$ | 29.3 | 37.8 | 0.04 | 3 |
| 20 | $Ti_{0.23}Al_{0.26}W_{0.35}Cr_{0.14}Co_2N$ | 31 | 42.1 | 0.05 | 2 |
| 21 | $Ti_{0.32}Al_{0.35}W_{0.28}Zr_{0.05}N$ | 25.3 | 38.3 | 0.05 | 2 |
| 22 | $Ti_{0.30}Al_{0.33}Nb_{0.07}W_{0.21}Si_{0.07}Co_{0.02}N$ | 28.5 | 45.6 | 0.13 | 0.2 |
| 23 | $Ti_{0.15}Nb_{0.35}W_{0.35}Si_{0.15}N$ | 28.6 | 37.7 | 0.09 | 8 |
| *24 | | — | | | |
| *25 | $Ti_{0.30}Al_{0.35}Nb_{0.34}W_{0.01}N$ | 52.3 | 43.4 | 0.08 | 0.5 |
| *26 | $Ti_{0.30}Al_{0.35}Nb_{0.35}N$ | 50.4 | 49.8 | 0.12 | 10 |

The samples marked "*" are out of the scope of the present invention.

TABLE 5

| | | Columnar particle | Wear | |
|---|---|---|---|---|
| Sample No. | Composition | Mean width of particle ($\mu$m) | width of flank face (mm) | Cutting edge condition |
| 14 | $Ti_{0.41}Al_{0.56}W_{0.03}N$ | 0.24 | 0.032 | Excellent |
| 15 | $Ti_{0.44}Al_{0.48}W_{0.03}Si_{0.02}Nb_{0.03}N$ | 0.21 | 0.015 | Excellent |
| 16 | $Ti_{0.42}Al_{0.49}W_{0.05}Ta_{0.04}N$ | 0.24 | 0.025 | Excellent |
| 17 | $Ti_{0.40}Al_{0.50}W_{0.04}Y_{0.06}C_{0.1}N_{0.9}$ | 0.12 | 0.033 | Minute chipping |
| 18 | $Ti_{0.42}Al_{0.49}W_{0.04}Hf_{0.05}C_{0.2}N_{0.8}$ | 0.23 | 0.036 | Minute chipping |
| 19 | $Ti_{0.38}Al_{0.48}W_{0.04}Mo_{0.10}N$ | 0.24 | 0.027 | Excellent |
| 20 | $Ti_{0.41}Al_{0.51}W_{0.04}Cr_{0.04}N$ | 0.29 | 0.038 | Minute chipping |
| 21 | $Ti_{0.5}Al_{0.45}W_{0.02}Zr_{0.03}N$ | 0.25 | 0.017 | Excellent |
| 22 | $Ti_{0.40}Al_{0.53}Nb_{0.04}W_{0.01}Si_{0.02}N$ | 0.33 | 0.024 | Excellent |
| 23 | $Ti_{0.46}Nb_{0.36}W_{0.09}Si_{0.04}N$ | 0.28 | 0.032 | Minute chipping |
| *24 | $Ti_{0.40}Al_{0.42}Mo_{0.18}N$ | 0.41 | 0.078 | Large chipping |
| *25 | $Ti_{0.44}Al_{0.50}Nb_{0.04}W_{0.01}N$ | 0.32 | 0.115 | Large chipping |
| *26 | $Ti_{0.44}Al_{0.48}Zr_{0.08}N$ | 0.22 | 0.088 | Large chipping |

The samples marked "*" are out of the scope of the present invention.

As can be seen from Tables 1 to 5, in Samples No. 11, No. 12 and No. 24, in which the dispersed particles (the granular particles) of the invention were absent, the occurrence of chipping at the cutting edge led to early fracture. Even in Sample No. 13 in which the granular particles as being the dispersed particles of WC were dispersed, Sample No. 26 in which W was not contained in the granular particles, and Sample No. 25 in which the content of Nb in the granular particles was the largest as compared with the columnar particles, the occurrence of chipping at the cutting edge led to early fracture.

On the other hand, in Samples Nos. 1 to 10 and Samples Nos. 14 to 23, in which the granular particles as being the dispersed particles of the invention were dispersed, fracture resistance was improved, exhibiting excellent cutting performance.

Example 2

In the method of manufacturing end mills described in Example 1, the compositions of the above-mentioned targets were adjusted by using an ark ion plating device, and a third target having a metal aluminum (Al) content two times larger than the main target was prepared separately from the above-mentioned first target and second target. Subsequently, end mills were manufactured in the same manner as in Example 1, except for the coating condition that the discharge power to the third target was set at zero in the start of coating, and the bias voltage was then increased every two minutes toward the latter part of the coating, and the bias voltage was 50V in the termination of the coating. The analysis of the coating layer was carried out in the same manner as in Example 1, and the results were presented in Table 6.

The layer thickness measurement and the quantitative analysis of the composition of the coating layer were carried out in the same manner as in Example 1. The data thus obtained were used to calculate the ratio of the content $b_b$ of Al in the coating layer immediately above the substrate and the content $b_s$ of Al in the vicinity of the surface of the coating layer, ($b_s/b_b$). Further, an oxidation test was conducted in which each end mill was heated to 1000° C. at a temperature rise rate of 10° C./min in the atmosphere, and held for one hour and then cooled at a temperature cooling rate of 10° C./min. Then, the weight change rate before and after the test was measured. The results were presented in Tables 6 and 7.

Further, the cutting test under the following cutting conditions was carried out using the obtained end mills by applying the cutting edge of the individual end mill to a working portion of a cutting object (a work material). The results were presented in Table 7.

Cutting method: Shoulder cutting (down-cut)
Work material: SKD11
Cutting speed: 80 m/min
Feed rate: 0.02 mm/tooth
Cut: Depth of cut $a_p$=18 mm×lateral length of cut $a_e$=1.5 mm
Cutting state: Air blow
Evaluation method: The presence and absence of chipping, and the measurements of the wear width of the flank face after a 50-minute cutting

TABLE 6

| Sample No. | Target First target (Main) | Target Second target (Sub) | Target Third target (Sub) | Coating condition Method[1] | Coating condition Bias voltage (V) | Coating condition Time (min.) | Coating layer Composition | Coating layer Layer thickness (μm) | $b_s/b_b$ |
|---|---|---|---|---|---|---|---|---|---|
| 27 | TiAl | NbN + W | Al | AIP | 100 | 35 | $Ti_{0.40}Al_{0.53}Nb_{0.04}W_{0.03}N$ | 3.5 | 1.13 |
| 28 | TiAlNbSi | WN + W | Al | AIP | 150 | 30 | $Ti_{0.42}Al_{0.48}W_{0.04}Si_{0.03}Nb_{0.03}N$ | 3.0 | 1.12 |
| 29 | TiAlTa | WN + W | Al | AIP | 120 | 35 | $Ti_{0.40}Al_{0.48}W_{0.07}Ta_{0.05}N$ | 3.5 | 1.20 |
| 30 | TiAlY | WN | Al | AIP | 200 | 35 | $Ti_{0.40}Al_{0.49}W_{0.05}Y_{0.06}Co_{0.1}N_{0.9}$ | 3.2 | 1.25 |
| 31 | TiAlHf | WN | Al | AIP | 150 | 8 | $Ti_{0.40}Al_{0.48}W_{0.06}Hf_{0.06}C_{0.2}N_{0.8}$ | 0.9 | 1.09 |
| 32 | TiAlMo | NbN + Nb | — | AIP | 80 | 20 | $Ti_{0.36}Al_{0.48}Nb_{0.05}Mo_{0.11}N$ | 2.2 | 1.18 |
| 33 | TiAlCr | NbN + Nb | Al | AIP | 60 | 35 | $Ti_{0.40}Al_{0.51}Nb_{0.05}Cr_{0.04}N$ | 3.3 | 1.28 |
| 34 | TiAlZr | NbN | — | AIP | 120 | 20 | $Ti_{0.5}Al_{0.45}Nb_{0.02}Zr_{0.03}N$ | 1.9 | 1.00 |
| 35 | TiAl | WN | Al | AIP | 150 | 30 | $Ti_{0.40}Al_{0.56}W_{0.04}N$ | 2.9 | 1.35 |
| 36 | TiSi | NbN + W | Al | HC | 90 | 20 | $Ti_{0.45}Nb_{0.30}W_{0.15}Si_{0.1}N$ | 2.3 | 1.15 |

[1]Method
AIP: Arc ion plating method,
HC: Hollow cathode ion plating method
SP: Sputtering method

TABLE 7

| Sample No. | Mean width of columnar particle (μm) | Granular particle (Dispersed particle) Mean grain size (μm) | Granular particle (Dispersed particle) Area ratio (% by area) | N ratio (mol %) Central part | N ratio (mol %) Outer peripheral part | weight change rate (%) | Wear width of flank face (mm) | Cutting edge condition |
|---|---|---|---|---|---|---|---|---|
| 27 | 0.21 | 0.11 | 6 | 25.4 | 37.2 | 1.5 | 0.024 | Excellent |
| 28 | 0.2 | 0.07 | 3.5 | 20.2 | 46.1 | 0.4 | 0.012 | Excellent |
| 29 | 0.22 | 0.15 | 2 | 26.1 | 39.4 | 0.9 | 0.019 | Minute chipping |
| 30 | 0.18 | 0.15 | 9 | 20.2 | 51.2 | 2.2 | 0.025 | Excellent |
| 31 | 0.2 | 0.09 | 7 | 24.9 | 45.1 | 2.8 | 0.028 | Excellent |
| 32 | 0.27 | 0.05 | 5 | 30.2 | 38.5 | 0.6 | 0.016 | Excellent |
| 33 | 0.33 | 0.09 | 7 | 30.9 | 42.1 | 3.3 | 0.032 | Excellent |
| 34 | 0.25 | 0.12 | 5 | 25.1 | 39.5 | 4.5 | 0.035 | Excellent |
| 35 | 0.35 | 0.11 | 12 | 28.5 | 44.9 | 5.8 | 0.038 | Minute chipping |
| 36 | 0.31 | 0.09 | 3 | 30.1 | 38.8 | 1.2 | 0.022 | Excellent |

As can be seen from Tables 6 and 7, in Samples Nos. 27 to 31, 33, 35 and 36, in which the ratio of the Al content in the surface of the coating layer was higher than that of the coating layer in the vicinity of the substrate, the oxidation resistance at high temperatures in the surface of the coating layer was further improved, exhibiting excellent cutting performance even under severe cutting conditions.

EXPLANATION OF REFERENCE

| 1 | Substrate |
| 2 | Coating layer |
| 3 | Columnar particle |
| 4 | Granular particle |
| 5 | Bulky particles (Droplets) |

The invention claimed is:

1. A surface coated tool comprising:
a substrate; and
a coating layer superimposed on the surface of the substrate and containing Ti and W in the form of nitride or carbonitride,
wherein the coating layer comprises a matrix and dispersed particles dispersed into the matrix, and
the W content of the dispersed particles is larger than the W content of the matrix, and a difference in the W content between the matrix and the dispersed particles is larger than a difference in other ingredient content.

2. The surface coated tool according to claim 1, wherein the dispersed particles are $WN_x$ provided $0 \leq x \leq 1$.

3. The surface coated tool according to claim 1 or 2, wherein the matrix is composed of columnar particles.

4. The surface coated tool according to claim 1, wherein the dispersed particles are composed of granular particles.

5. The surface coated tool according to claim 3, wherein the columnar particles have a mean width of 50 to 500 nm.

6. The surface coated tool according to claim 4, wherein the granular particles have a mean grain size of 5 to 200 nm.

7. The surface coated tool according to claim 1, wherein the coating layer is composed of
$(Ti_{1-a-b-c}Al_a M_b W_c)(C_{1-y}N_y)_z$ wherein M is one or more types selected from the groups 4, 5 and 6 elements in the periodic table excluding Ti and W, rare earth elements and Si, $0.4 \leq a \leq 0.65$, $0 \leq b \leq 0.5$, $0.01 \leq c \leq 0.3$, $0.25 y \leq 1$, and $0.9 \leq z \leq 1.1$.

8. The surface coated tool according to claim 1, wherein the ratio of the dispersed particles in cross-sectional structural observation is 0.1 to 25% by area.

9. The surface coated tool according to claim 1, wherein an N content ($x_{suf}$) in the outer peripheral part of the dispersed particles is larger than an N content ($x_{in}$) in the central part of the dispersed particles.

10. The surface coated tool according to claim 1, wherein an Al content $b_s$ in the surface of the coating layer is larger than an Al content $b_b$ of the coating layer in the vicinity of the substrate.

11. The surface coated tool according to claim 10, wherein the ratio of the $b_s$ and the $b_b$, ($b_s,b_b$), is 1.1 to 1.25.

12. The surface coated tool according to claim 10 or 11, wherein a weight change rate when the surface coated tool is held at 1000° C. in the atmosphere for one hour is less than 2.5%.

13. A method of working a cutting object comprising the steps of:
preparing a cutting tool comprising the surface coated tool according to claim 1, and having a cutting edge;
bringing the cutting edge of the cutting tool into contact with a cutting object; and
cutting the cutting object by the cutting tool.

* * * * *